United States Patent
Schwertner et al.

(10) Patent No.: US 7,869,147 B2
(45) Date of Patent: Jan. 11, 2011

(54) HOLDING DEVICE FOR OPTICAL ELEMENT

(75) Inventors: Tilman Schwertner, Aalen (DE); Stefan Hembacher, Bobinger (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 761 days.

(21) Appl. No.: 11/784,511

(22) Filed: Apr. 6, 2007

(65) Prior Publication Data

US 2007/0285645 A1 Dec. 13, 2007

Related U.S. Application Data

(60) Provisional application No. 60/790,057, filed on Apr. 7, 2006.

(30) Foreign Application Priority Data

Apr. 7, 2006 (DE) .................. 10 2006 016 533

(51) Int. Cl.
*G02B 7/02* (2006.01)
(52) U.S. Cl. .................. 359/819; 359/811; 359/820; 359/513; 355/30; 451/390; 248/683
(58) Field of Classification Search .................. 359/811, 359/819, 820, 886, 896, 355, 358, 513, 665; 355/30, 53, 57, 67, 77; 285/187, 367, 368; 451/28, 41, 42, 384, 390; 248/683; 362/240, 362/267, 633; 73/590, 800, 841
See application file for complete search history.

(56) References Cited

U.S. PATENT DOCUMENTS

| | | | | |
|---|---|---|---|---|
| 2,699,633 A | * | 1/1955 | Lapenas et al. | 451/41 |
| 4,726,656 A | * | 2/1988 | Schofield et al. | 359/603 |
| 5,374,970 A | * | 12/1994 | Satoh et al. | 396/29 |
| 6,716,161 B2 | * | 4/2004 | Higuma et al. | 600/133 |
| 6,918,822 B2 | * | 7/2005 | Arai et al. | 451/42 |

(Continued)

FOREIGN PATENT DOCUMENTS

DE 242880 A1 2/1987

(Continued)

*Primary Examiner*—Loha Ben
(74) *Attorney, Agent, or Firm*—Lando & Anastasi, LLP (57) ABSTRACT

A device or the operation of a device for the holding, especially sealing support of an optical element, especially an optical lens with at least one holding element for mounting the optical element and preferably at least one sealing element for sealing contact at at least a part of the optical element and/or the holding element, wherein the sealing element or at least a part thereof is displaceable between a first position, in which the sealing element rests against the optical element and a second position, in which the sealing element is spaced apart from the optical element, or wherein the sealing element is switchable such that it rests against the optical element under different contact pressure or adjustable contact force. The holding element can either take on the holding function alone and independently of the sealing element or work together with the sealing element in this regard. The sealing element can also be provided separately and independently of the holding element, such that the holding element is optimizable to the holding function. Especially, the present invention concerns an immersion objective for microlithography in which at least one actuatable sealing element is provided.

47 Claims, 5 Drawing Sheets

U.S. PATENT DOCUMENTS

| | | | |
|---|---|---|---|
| 6,966,231 B2 * | 11/2005 | Sheplak et al. | 73/861 |
| 7,438,775 B2 * | 10/2008 | Arai et al. | 156/64 |
| 7,460,206 B2 * | 12/2008 | Weissenrieder et al. | 355/30 |
| 7,578,725 B2 * | 8/2009 | Igarashi et al. | 451/41 |

FOREIGN PATENT DOCUMENTS

| | | |
|---|---|---|
| EP | 1420299 A2 | 5/2004 |
| JP | 2003140015 A | 5/2003 |
| WO | 2005101121 A2 | 10/2005 |

* cited by examiner

HOLDING DEVICE FOR OPTICAL ELEMENT

CROSS-REFERENCE TO RELATED APPLICATIONS

This application claims the benefit under 35 U.S.C. 119(e) of U.S. Provisional Application No. 60/790,057 filed Apr. 7, 2006, and also claims the benefit under 35 U.S.C. 119(a)-(d) of German Patent Application DE 10 2006 016 533.0, filed Apr. 7, 2006, both of which are herein incorporated by reference in their entireties.

BACKGROUND

1. Field of Invention

The present invention is directed to a device for holding, especially sealing support of an optical element, especially a last optical element of an immersion objective that comes into contact with a liquid, preferably for holding of an optical lens. The device has at least one holding element for mounting the optical element and at least one sealing element for sealing contact with at least one part of the optical element and/or the holding element. Further, the invention refers to a method for the operation of such a device.

2. Discussion of Related Art

In objectives, optical elements, like optical lenses, are held in a mount, wherein usually sealing compounds, such as adhesives and the like are used so that, for example, dirt or other foreign particles may be prevented from penetrating into the space between optical element and mount and thus into the objective.

Such sealing compounds, like adhesives, but also other joining techniques that are used for connecting optical element and mount possess the disadvantage that through different thermal expansion of the components involved, through relaxation of stresses from the joining process, through swelling or shrinking of participating components, through chemical reactions, such as postcuring, embrittling etc. especially over the service life of the objective, different mechanical properties, such as holding and sealing forces are present. However, these also cause variation in the optical characteristics of the optical element through elastic deformation of the optical element. This is especially troublesome in the case of very precise objectives, for example projection objectives in microlithography.

Especially in the case of immersion objectives, whose last optical element, for example in the form of an optical lens or a transparent protective element, is in contact with an immersion liquid, such problems regarding undesirable introduction of mechanical stresses are caused by adhesive and/or sealing compounds that are used for sealing between the optical element and a surrounding mount, which is flange-mounted in the objective. Additionally, the sealing and/or adhesive compounds can lead to problems with aging effects that, in turn, can lead to stress being introduced into the held and sealed lens element. Additionally, adverse chemical reactions may occur between the immersion liquid and the sealing and/or adhesive compounds.

SUMMARY OF THE INVENTION

It is therefore the object of the present invention to eliminate the disadvantages of the prior art and especially to create a device for holding, and especially sealing support, of optical elements, in which interferences due to the holder or seal on the optical characteristics can be largely avoided or limited, while at the same time it may be guaranteed that undesirable articles or materials do not cause contamination of the objective space. Especially, such a solution shall be easy to manufacture and realize.

This object may be achieved with a device for holding and/or sealing an optical element, such as an optical lens, the device comprising at least one holding element for mounting the optical element, and at least one sealing element for sealing contact at at least a part of the optical element and/or the holding element, wherein at least a part of the sealing element is displaceable between a first position in which the sealing element seals against the optical element and/or the holding element, and a second position in which the sealing element is spaced apart from the optical element and/or holding element. This object may further be achieved with a corresponding apparatus in which the device is used, such as an objective, as well as by a method for the operation of such a device or objective, and a microlithographic projection exposure system.

Aspects of the present invention start out from the realization that a holder for an optical element with certain, high holding forces and/or sealing support of an optical element in a holder or a mount is not always necessary and especially not always when the optical element is in actual optical use. Rather, high holding forces are needed, for example, only during transport of the objective or other changes of use. In the same way, the sealing function is likewise predominantly necessary in times when the optical element does not exercise its optical function, or the sealing function can be realized during this period by other suitable measures, for example a gas seal. Especially, the holding and sealing functions can be realized separately and independently of each other. This in turn leads to the fact that the holder can actually be optimized as regards the holding function and the associated stress situation, without other opposing functions, such as the sealing function, having to be considered.

The inventors have accordingly recognized that an actuatable, especially a switchable or adjustable, sealing and/or contact element can be used to effect the sealing and/or holding of the optical element against a housing, mount, holding element or other component in order that the sealing and/or holding function may be provided at the specified necessary times, while it is possible at other times, e.g. actual optical use of the optical element when such functions or influences are a hindrance, to switch off or change these appropriately.

What this generally means is that the sealing and/or holding function for an optical element is designed to be at least partly switchable and/or adjustable, whereby, when reference is made in the following only to sealing elements, it is always also to be understood that such a sealing element, aside from the exclusive sealing function, can take on a holding function for the optical element additionally or alternatively.

Accordingly from a first aspect of the present invention, a sealing element is provided for the purpose of at least partially tight, especially gas-tight contact against a part of the optical element and/or the holding element, for example a mount or a housing part, which is movable between a first position in which the sealing function is exercised especially by contact of the sealing element with the optical element and a second position in which the sealing element is spaced at a distance from the optical element. Alternatively or additionally, corresponding mobility of the sealing element relative to the holding element, for example a mount, is also conceivable.

From a further aspect, the sealing element is switchable such that it rests against the optical element with different contact pressure or adjustable contact force. Thus, in a first state relative to the optical element or the holding element, at least a part of the sealing element can, under a first pressure, make contact and, in a second state, under a second pressure reduced in comparison to the first pressure, make contact with the optical element or the holding element. The aforementioned first and second positions can be supplemented or replaced by the first and second pressures. As mentioned, the sealing element need not be movable between the aforementioned positions, especially, if it is elastically formed.

Application of the contact pressure or the adjustable contact force can preferably take place by movement of the sealing element or at least a part of it, for example in the case of an elastic, especially rubber-elastic sealing element, into different positions relative to the optical element and/or holding element.

The holding element preferably has a mount that completely surrounds the optical element along the lateral surface and is especially formed so as to be gas-tight and/or liquid-tight in order that, through interaction with the actuatable sealing element, an altogether gas-tight and/or liquid-tight holding of the optical element, for example in an objective, may be facilitated.

According to one embodiment, if the sealing element is arranged between the surrounding holding element and the optical element to be held, the sealing element, through corresponding sealing contact with the optical element in connection with the holding element, can also take on the supporting and bearing function for the optical element. Preferably, one or more further supporting elements may be provided, which mount the optical element additionally or alternatively to the holding element, especially if the optical element is exercising its optical function.

In one example, it is possible to provide a device in which contact of the sealing element with the participating sealing surfaces is not completely eliminated in the relaxed state either, but the holding or pressing forces are only slightly reduced. In this case, residual forces remain that act on the optical element, but that must only be large enough to hold or mount the optical element during optical use, but, for example, no longer ensure sealing.

From a further aspect of the present invention, for which protection is also sought independently, holding element and sealing element are formed such that they are provided separately and independently from each other and/or act such that the sealing and holding function are separate and independent. This can be effected for example in a simple manner by providing the sealing element not between the holding element, for example, in the form of a mount, and the optical element to be held, but rather effecting a seal relative to the optical element and/or holding element at a sealing surface transverse to the optical axis. Thus it is possible for the holding element to be optimized such that it introduces little or no stress into the optical element, while the sealing function is used only as needed, but especially if the optical element is not in optical use.

Accordingly, from a further aspect of the present invention, protection is sought for a device for the holding of an optical element that ensures a low-stress holding of the optical element. For example, such a holding device may be formed so as to be permeable for liquids, such as immersion liquids.

Preferably, this is achieved by the holding element's having a few holding points or surfaces spaced apart from each other and thus especially providing a positive holding.

Accordingly, the provision of sealing and/or adhesive compounds in connection with the holding element can be eschewed. This has the advantage that neither mechanical stresses from the sealants and adhesives are introduced onto the optical element nor reactions with an immersion liquid need to be feared. Furthermore, no aging effects of the adhesive and/or sealing compounds arise.

In connection with such a pure holding, which can be limited to the holding function and optimized appropriately in that regard, corresponding actuatable sealing elements can then be provided, which especially independently of the holding element serve to seal the optical element and/or the holding element or the accommodating objective against impurities, immersion liquids and the like.

According to one embodiment, corresponding actuatable, i.e. switchable and/or adjustable, sealing elements can find use that are displaceable between a sealing position and a non-sealing position or exercise their sealing function under different contact pressure or adjustable contact pressure. The setting and alteration of the contact pressure or the contact force as well as the change in the positions of the sealing element or parts thereof can take place gradually or steplessly in a plurality of settings or positions.

In one example, the sealing element(s) can be provided in any suitable way at the holding element and/or optical element, especially both at the lateral surface of the optical element and at the end face of the optical element. Especially, the sealing element can be provided at the same side as the holding element and especially between holding element and optical element, or holding element and sealing element or sealing elements are provided at different sides of the optical element. For example, the holding element can be provided along the lateral surface of the optical element, while the sealing element(s) are arranged at the end face of the optical element.

Accordingly, the sealing element or parts thereof can preferably also execute not only a movement in the direction of the plane of the optical element, that is, transverse to the optical axis, but especially also parallel to the optical axis or combinations thereof. For the execution of a corresponding movement, the sealing element or a part thereof can be provided on one or more movable carriers, for example a cover plate or the like.

In one example, the sealing element is preferably designed such that it comprises at least one movable component, for example, in the manner of a folding bellows or the like, and/or at least one elastic, especially, rubber-elastic component, by means of which the switching or adjusting processes can be accomplished. It is therefore especially advantageous for the sealing surface to be formed by the movable and/or elastic component.

Preferably, the sealing element has an actuator, which is used for the actuation of the adjustment or switch. Hydraulic, pneumatic or other mechanical or electromechanical components, such as piezo elements, may serve as actuator. Advantageously, a reinforcing element may be provided between actuator and actuated sealing surface.

In an advantageous embodiment, the sealing element can be provided in the form of a sealing ring such that, in the case of the usually rotationally symmetrical objectives, in which the device is used for the holding and/or sealing of an optical element, simple and easy arrangement of the seal can take place. Actuation of the sealing element can also be carried out by forming the sealing ring as a pneumatic or hydraulically inflatable sealing ring.

In a further preferred embodiment, the sealing element(s) can be formed such that the sealing element with its sealing surface is held contactlessly at a distance from the sealing surface to be sealed such that a gap is formed. This kind of seal can be used especially for sealing against immersion liquids, since the gap between the sealing surface to be sealed and the sealing element can be selected or the surfaces of the participating sealing surfaces and the liquid to be held at bay, for example the immersion liquid, are matched to each other such that surface tension effects prevent passage of the liquid, especially immersion liquid, through the gap.

In a further preferred embodiment, a control and/or regulation unit is provided, which acts along with a detection unit which captures the state of the optical element and/or the state of the area in front of the optical element and/or in front of the holding element and/or the state of the holding element by means of suitable sensors and the like in order that actuation of the actuatable sealing element may be effected as a function of the detected data or states identified.

In one example, the detection unit can comprise a position sensor, a liquid sensor, an optical sensor, a vibration sensor, a movement sensor and/or combinations thereof. With the help of these sensors, it is possible for example to determine whether or not the presence of an immersion liquid or a rise in the same necessitates the use of a seal. The positional or vibrational sensors can cause the actuatable seal to take up its sealing position, if, for example, a system malfunction, e.g. due to vibration, is detected or the replacement of the wafer in a projection exposure system can give rise to possible impurities.

The optical element can be provided as an optical lens or a transparent protective element, which, for example, can be provided in front of the last optical lens of an immersion objective to protect the last lens. Generally, for the purposes of the present application, the term optical element is to be interpreted very widely and includes all elements that are arranged in corresponding components, such as objectives, especially immersion objectives, in the optical path. In addition, the term "objective" is to be understood as a general optical device.

In the same way, the expression holding element comprises all components that can serve or contribute to the holding of an optical element, such as especially corresponding mounts, objective housings or other holding devices. Especially, the arrangement of a mount in an objective housing can be understood as a two-piece holding element.

From a further aspect, the present invention also refers to an objective of a projection exposure system, especially a projection exposure system for microlithography, that serves the purpose of imaging an object area on an image area on or in a photosensitive layer by means of an illumination radiation beam through an imaging process, wherein, during the imaging process, preferably at least the image area on or in the photosensitive layer is covered by a liquid, which is at least partly penetrated during the imaging process by the illumination radiation beam. In such an objective, the optical element of the objective lying closest to the liquid (last optical element), or a transparent element in front of this element in the direction of the liquid or any other element separated from its neighbour element and defining a gap between itself and this element has a device in accordance with the previously described aspects of the present invention in which it is held.

In one embodiment, with the actuatable sealing element and/or the low-stress holder, preferably in connection with a corresponding actuatable sealing element, objectives can be advantageously realized that ensure very good optical characteristics combined with simultaneous reliable sealing of the objective space.

In another embodiment, an inventive device for the holding and/or sealing of an optical element may also be used in the case of an objective, in which, for example, in the optical path of the objective, e.g. the last lens element and a final element of an immersion projection exposure objective, a gap with an air layer is formed. Such a gap can be closed with the actuatable sealing element by mounting an optical element adjacent the gap if necessary, for example at times when higher dirt input is possible.

In one example, the previously described contactless sealing element can be used here for maintaining a residual gap. This is especially advantageous if the so-called final element of the objective is held via so-called Lorenz actuators, which ensure that the optical elements of the projection objective are mounted vibration-free such that, for example, no vibrations of the wafer are transferred via the immersion liquid and the final element to the optical elements of the projection objective.

Preferably, the assigned actuatable sealing element can be controlled or regulated in such a manner that the distance of the sealing element from the surface to be sealed is kept constant.

Generally, in the case of such objectives, corresponding control and/or regulation units can be provided that, based on different states or process data, can effect actuation of the sealing element(s).

In one example, liquid feed and discharge devices can be provided for the feeding and discharge of immersion liquids, outgasing devices for degassing the immersion liquids, adjusting devices for arrangement and/or alignment of substrates and/or masks and/or other elements of the objective that generate corresponding output signals for the control and/or regulation of at least one actuatable sealing element.

Additionally, it is also advantageous if a corresponding actuatable sealing element that may have the characteristics of the corresponding sealing elements of the previously described devices is also assigned with reference to the photosensitive layer to be exposed or a support for it, i.e. a support for the wafer. Thus it is possible, especially in turn via a contactless sealing element, to reliably limit in a simple manner the area in which immersion liquid should be present on the wafer. Especially, such an actuatable sealing element assigned to the photosensitive layer can be provided at a sealing element assigned to the last optical element, especially opposingly, at a carrier thereof or at a separate, especially movable, sealing bearing.

With a corresponding control and regulation unit, which may especially also be identical with the control and regulation unit for the sealing element(s), which is/are assigned to the optical element(s), or may be combined with these, the sealing element can then be held in turn relative to the photosensitive layer in a constant position, especially at a constant distance.

Preferably, the actuatable sealing element assigned to the photosensitive layer can be provided on the opposite side of a carrier or sealing bearing on which is already arranged the actuatable sealing element for the last optical element of the immersion objective, with the carrier additionally capable of being formed at the same time as a shielding element and additionally may have a further actuatable sealing element for the holding element. In such an embodiment, the sealing elements or parts thereof arranged on the carrier can be displaced or moved parallel to the optical axis in order that on one hand the objective space may be sealed and, on the other, the area of the wafer that is wetted by the immersion liquid may be defined. In accordance with a further aspect of the present invention, the operation of a corresponding device, an apparatus that has the device or the operation of a corresponding objective is placed under protection, with the actuatable sealing element(s) brought into sealing position or non-sealing position as a function of the corresponding device, system or objective states or the process steps.

In one embodiment, the process may be characterised accordingly by the fact that sealing of the optical element(s) takes place only if, for example, no imaging with the objective takes place, such that during the imaging process a stress-free or low-stress state of the optical elements is ensured. On the other hand, at times in which, for example, a wafer change is made and vibrations might be expected to cause contamination of the objective space, a seal can be provided.

When sealing elements are used with regard to the photosensitive layer or the wafer, they are used in the opposite way, such that, during the imaging process, it is ensured that immersion liquid is present only in the desired area, whereas, for example, in the case of interrupted immersion liquid feed, no sealing function is necessary.

BRIEF DESCRIPTION OF THE FIGURES

Further advantages, characteristics and features of the present invention are apparent from the following detailed description of preferred embodiments with reference to the accompanying drawings. In the drawings, which show in purely schematic form.

DETAILED DESCRIPTION

Figure 1:
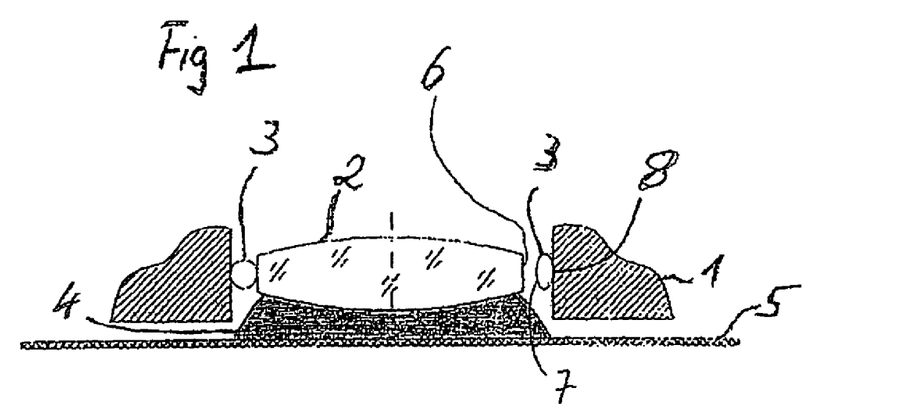
FIG. 1 is a cross-sectional view through a lens of an objective.

FIG. 1 shows a mount 1 in a cross-sectional view, in which an optical lens 2 is accommodated as an optical element. Between the lateral surface of the optical lens 2 and the mount 1 is provided around the optical lens 2 a peripheral seal 3, which rests against the sealing surface 8 such that it is gas-tight and/or liquid-tight relative to the mount 1, which also peripherally surrounds the optical element 2 about the lateral surface. Accordingly, the sealing surface 8 is likewise annularly formed.

In addition to the gas-tight and/or liquid-tight contact of the seal 3 at the mount 1, the seal 3 has a sealing surface 7, which can come into contact with the sealing surface 6 at the lateral surface of the optical lens 2. The sealing position, in which the sealing surface 7 of the seal 3 is in contact with the optical lens 2, is shown in the left half of FIG. 1, while the retracted or relaxed position of the sealing surface 7 of the seal 3, in which the sealing surface 7 is spaced apart from the sealing surface 6 of the optical lens, is shown in the right half of FIG. 1.

Thus, through corresponding contact of the sealing surface 7 of the seal 3 with the sealing surface 6 of the optical lens 2, it is possible to generate a gas-tight and/or liquid-tight seal between the optical lens 2 and the surrounding mount 1. In the retracted and/or relaxed state, the optical lens 2 is released such that no forces are exerted by the seal 3 on the optical lens 2. In this state, the optical lens 2 is held, e.g., by an additional supporting element, not shown, of the mount 1. Additionally, it is conceivable that the seal 3 is not retracted so far that a distance is created between the sealing surface 6 of the optical lens 2 and the sealing surface 7 of the seal 3, but rather that the seal 3 with the sealing surface 7 rests further against the sealing surface 6 of the optical lens, but exerts only just enough force on the optical lens required for holding the optical lens 2 in the mount 1 or for creating such a seal that imaging can occur through the optical lens 2 without interference from the seal 3.

The seal 3 of the inventive device shown in the embodiment of FIG. 1 is provided by an annular sealing tube that is hollow inside. Into the cavity can be introduced fluids or gases, by means of which the rubber-elastic sealing tube can be brought into a shape in which the sealing surface 7 of the seal 3 rests against the sealing surface 6 of the optical lens 2. The magnitude of the mutually contacting sealing surfaces and the sealing forces can be adjusted and varied over a wide range via the introduced quantity or applied pressure. To this end, only a feed and discharge opening, not shown, is needed for the fluids or gases to the seal or the annular rubber-elastic sealing tube. This can be provided, for example, in the mount 1.

In this way, it is possible to relax or retract the seal 3 during use of the optical element or the optical lens 2, that is, for example, during imaging of microstructures on the wafer 5, such that little or no force is exerted on the optical lens 2. The outcome of this is that the optical characteristics of the lens 2 are not affected by possible sealing forces on the optical lens 2. A necessary seal can, for example, be effected by a gas seal, with gas exchange occurring between the spaces bordering the seal. In the case of transport or other operations, for example, wafer changes, in which a gas seal is insufficient or can be realized only with difficulty, the seal 3 can be brought into the sealing state, such that sealing of the areas bordering the seal 3 above and below the optical lens 2 is reliably guaranteed. To this end, it is only necessary for the rubber-elastic sealing tube 3 to be filled with corresponding fluids or gases. Since the filling of the sealing tube 3 can be maintained, even without elaborate supply measures, by simply closing the feed opening of the sealing tube, such an embodiment is also especially also suitable for sealing during transport.

Generally, the lens 2 described above can be an optical element, e.g. a plane-parallel plate or a zone plate, a polarizer or a birefringent or optically active element.

Figure 2:
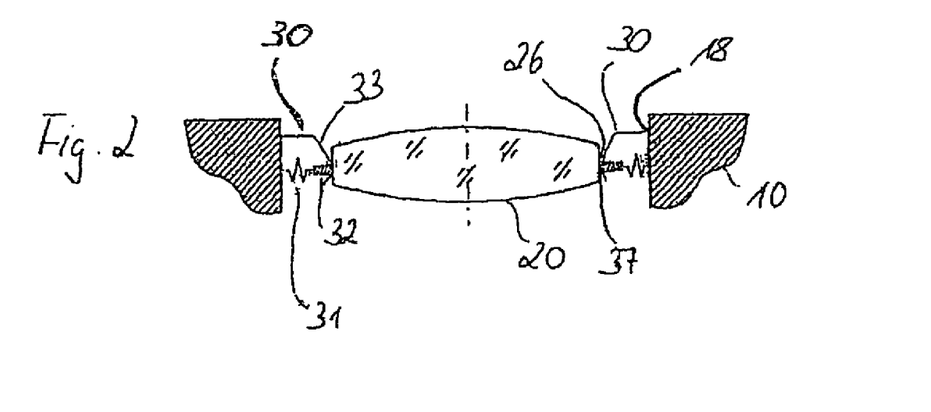
FIG. 2 is a cross-sectional view in accordance with FIG. 1 with a second embodiment of the present invention.
Figure 3:
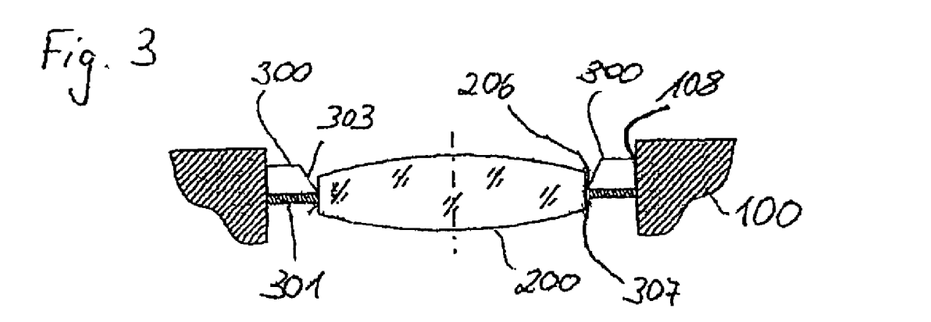
FIG. 3 is a cross-sectional view in accordance with FIGS. 1 and 2 with a third embodiment of the present invention.

FIGS. 2 and 3 show two further embodiments of the inventive device in an illustration similar to FIG. 1. In the embodiment of FIG. 2, a seal 30 is again arranged between an optical lens 20 and the surrounding mount 10, said seal being arranged gas-tight and/or liquid-tight on one hand via the sealing surface 18 at the mount 10 and, with the movable sealing surface 37, capable of coming into sealing contact with the sealing surface 26 of the optical lens 20.

However, the seal 30 of the embodiment of FIG. 2, in contrast to the embodiment of FIG. 1, is built up from an actuator 31 and a reinforcing ring 32 as well as a movable sealing membrane 33. The actuator 31, which may be formed by a hydraulic or pneumatic element, for example a piston, a mechanical or electromechanical adjusting device, especially a piezoelectric element, serves to expand or reduce the diameter of the reinforcing ring 32 in such a manner that contact of the sealing surface 37 of the seal 30 occurs at the sealing surface 26 of the optical lens 20. For this purpose, the movable sealing membrane 33 on the inside of the reinforcing ring 32 is provided in order to come into sealing contact with the sealing surface 26 of the optical lens 20.

The reinforcing ring 32 may be formed by an elastically deformable seal 3 (from FIG. 1) that is peripheral about the optical element, such that inflating the seal 3 causes the sealing membrane 33 to come into contact with the optical element. Depending upon the cross-section of the seal 3 employed, the actuator 31, for example, can be eliminated, such that the seal 4 forms both the actuator and reinforcing ring at the same time.

A similar structure of the device is shown in FIG. 3, with a reinforcing ring being eschewed here and the seal 300 formed only from a movable sealing membrane 303 and an actuator 301. Like the actuator 31, the actuator 301 can be formed by the most diverse components. Here, too, actuation of the actuator 301 causes contact of the sealing surface 307 of the seal 300 with the sealing surface 206 of the optical lens 200, such that, due to the seal at the sealing surface 108 as well as the seal at the sealing surfaces 206 and 307, a gas-tight and/or liquid-tight seal can be adjusted between mount 100 and optical lens 300, such that the spaces above and below the optical lens 200 are separated gas-tight and/or liquid-tight from each other. The optical lenses described in connection with FIG. 2 and FIG. 3, too, can generally be an optical element, e.g. a plane-parallel plate.

Figure 4:
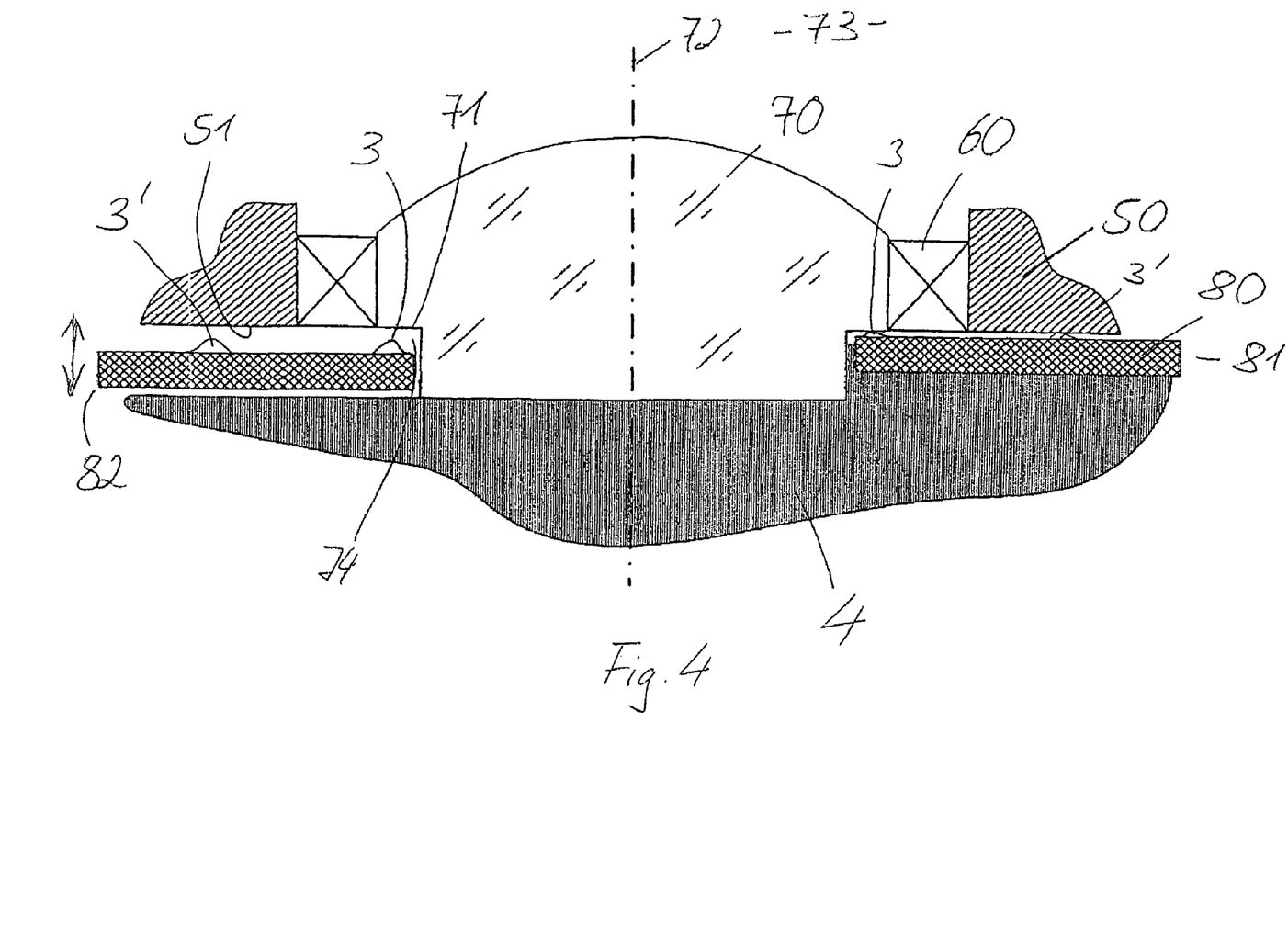
FIG. 4 is a cross-sectional view of a fourth embodiment of the present invention.

FIG. 4 shows the cross-sectional view of an immersion objective, in which a mount 50 supports an optical element 70 in the form of an optical lens or a transparent protective element via a holding device or a holder 60.

The lower surface of the optical element 70 is in contact with an immersion liquid 4 that is arranged, for example, above the photosensitive layer of a wafer. The optical element 70, the holding device 60 and the mount 50 are usually rotationally symmetrical with the optical axis 72. The symmetrical shape of the holding device 60 is especially advantageous, since non-uniform loads on the optical element 70 by the holding device 60 and stresses introduced as a result can thereby be avoided. Where the shape of the optical element is not rotationally symmetrical, the holding device is adapted to the shape or symmetry of the optical element.

The lower surface of the optical element 70 has a shoulder-shaped recess 74 that has a peripheral sealing surface 71 transverse to the optical axis 72.

In the area of the recess 74 is provided a sealing carrier 80 that has two annular peripheral seals 3 and 3' on its top side. Through actuation of the sealing carrier 80, by which the sealing carrier can be displaced up and down as indicated by the double arrow, the seals 3 and 3' can be brought into contact with the sealing surfaces 71 of the optical element or the sealing surface 51 of the mount 50 in order that sealing of the objective space 73 against the immersion liquid 4 may be effected thereby. At the same time, the sealing carrier 80 thereby acts as part of the seal or as shielding element against the immersion liquid 4. Through a corresponding form of the sealing carrier 80 or shielding element, the seal 3' can be dispensed with if the shielding element or the sealing carrier 80 extends far enough beyond the mount 50.

As may be readily seen in the left and right parts of FIG. 4, the sealing carrier 80 with the seals 3 and 3' on it can be brought from a non-sealing position 82 into a sealing position 81 and vice versa. In this way, it is possible to mount the optical element 70 with a holding device 60 for low-stress mounting in the mount 50, without this having to be formed so as to be gas-tight and/or liquid-tight, especially for sealing against the immersion liquid. Rather, the holding device 60 may be permeable to liquids, since, in the event of a rise in the immersion liquid 4, the sealing carrier 80 with the seals 3 and 3' can be brought into contact with the optical element 70 and the mount 50, such that effective sealing of the objective space 73 against the immersion liquid 4 occurs. As will be shown later, the actuation of the sealing carrier 80 can be controlled and/or regulated via a corresponding control and/or regulation unit.

On further embodiments, the sealing surface 71 at the optical element 70 can comprise an additional peripheral seal, or the seal 3 of the sealing carrier 80 is alternatively attached at the sealing surface 71 of the optical element 70. Furthermore, the sealing surface 71 of the optical element or the sealing surface 51 of the mount 50 need not be arranged transverse to the optical axis, and the sealing surfaces 71, 51 can have a profile for accommodating at least a part of the seal 3.

Figure 5:
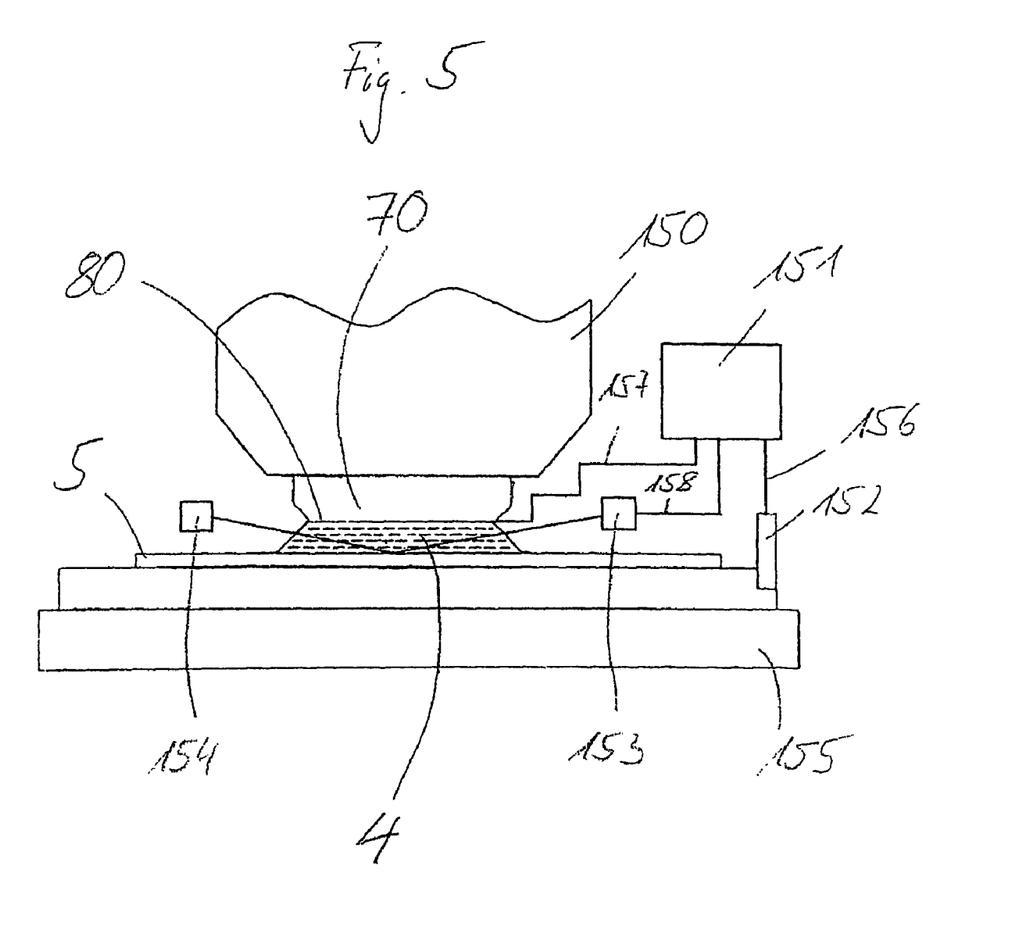
FIG. 5 is a cross-sectional view of a first embodiment of an inventive immersion objective.

FIG. 5 shows a part of an immersion objective 150 with the optical final element 70, which, for example, may be a purely transparent protective element.

The sealing carrier 80 is provided on the side in contact with the immersion liquid 4, as shown in FIG. 4. It is actuated by the control and/or regulation unit 151 via the signal and data line 157 in order to move by means of a corresponding actuator (not shown) into the sealing position 81 or into the non-sealing position 82 (see FIG. 4). Additionally further sensors are assigned to the immersion objective 150 that deliver their output signals to the control and/or regulation unit 151, which effects or cancels sealing as a function of these signals. On one hand, an optical detection unit 153, 154 with light emitter 154 and light receiver 153 is provided that can, for example, detect the presence of an immersion liquid 4 on the wafer 5 and report this to the control and/or regulation unit 151 via the data and signal line 158. Furthermore, a position sensor 152 is provided for detecting the position of the support 155 for the wafer 5 that in turn delivers a signal concerning the position of the wafer 5 or the waferstage 155 to the control and/or regulation unit 151 via the data and signal line 156. On the basis of these data, the sealing function can then be controlled or regulated via a corresponding data processing program.

Figure 6:
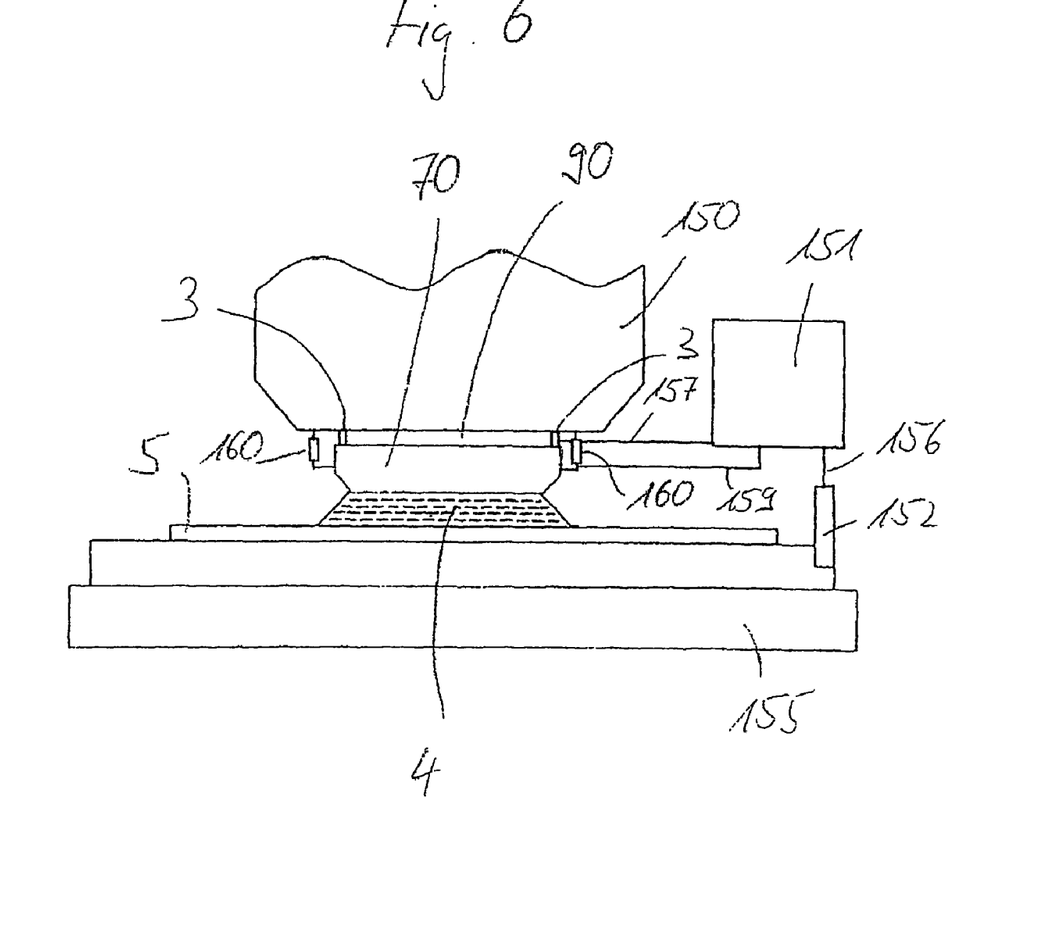
FIG. 6 is a cross-sectional view of a second embodiment of an inventive immersion objective.

FIG. 6 shows a further embodiment of an immersion objective 150, in which the final unit 70 is provided at a distance from the optical elements of the immersion objective 150 in order that a gap 90 may be formed between the final unit 70 and the remaining immersion objective 150. The final unit 70 is arranged at the immersion objective 150 via Lorenz actuators 160 that compensate tremors and vibrations, which, for example, would be transferred through the support (wafer-stage) 155 to the immersion objective 150 via the immersion liquid 4.

Between the final unit 70 and the remaining part of the immersion objective 150 is provided an annularly rotating seal 3 for the purpose of sealing the gap 90, said seal in turn being actuatable, that is, switchable or adjustable, and actuatable via the control and/or regulation unit 151 via the data and signal line 157.

For the purpose of control or regulation of the seal 3, data may be used that are sent by the Lorenz actuators 160 to the control and/or regulation unit 151 via the data and signal line 159. Additionally or alternatively, the positional data of the sensor 152 may in turn be used, in a manner similar to the embodiment of FIG. 5.

By controlling or regulating the sealing function on the basis of the state of the Lorenz actuators, especially when a contactless seal 3 is used that does not have direct contact with the sealing surface, a constant distance can be ensured between the seal 3 and its opposite sealing surface of the immersion objective 150, such that no transmission of vibrations can take place here, either. Furthermore, the seal 3 can be connected only if the immersion liquid level reaches a critical height and threatens to penetrate into the gap 90. In this embodiment, the seal 3 is barely activated or not at all in normal operation, i.e. when the immersion liquid is below the gap 90. Such an embodiment can be used e.g. for microlithographic projection exposure systems having an illumination device with an object field exchangeable by the illumination device, with the object field usually being almost an object plane in which a mask is arranged. The object field is then imaged by means of a projection objective e.g. an immersion objective 150, onto an image field, with the image field being almost an image plane, in which is arranged, for example, a wafer 5 with a photosensitive layer. The projection objective comprises at least a first optical element 70 with a first and a second optical surface. The first optical element can be a lens, a plane-parallel plate, or even a group of lenses, with the first surface being at least partially in direct contact with the immersion liquid 4 during imaging of the object field onto the image field (usually a mask structure on a photosensitive layer of a wafer 5). In this connection, the immersion liquid usually has a first operating state, in which only the first surface has contact with the immersion liquid, i.e. contacts this or immerses into this. This means that the second optical surface, e.g. the upper side of the final unit 70 facing away from the immersion liquid 4 (see FIG. 6), or a second optical element of the projection objective in the first operating state of the immersion liquid are not touched by the latter, i.e. the second surface or the second optical element is spaced apart from the immersion liquid. Furthermore, by means of a control or regulating device a regulatable or controllable seal is activated according to the above embodiment as required. In this regard, the second optical surface or the second optical element are protected against contact with the immersion liquid in the case of a second state of the immersion liquid deviating from the first operating state. This second state can, for example, be a rise in the immersion liquid 4 in FIG. 6, such that, without activation of the seal, this penetrates into the gap 90 and thus comes into contact with the second surface (top side of the final unit 70), or even penetrates into the objective 150 and comes into contact with a second optical element of the objective 150. The second optical surface or the second optical element are protected by the controllable or regulatable seal against contact with the immersion liquid. The operating state of the immersion liquid can be monitored by means of a sensor unit and, in the case of deviation from the first operating state, the seal is controlled or regulated in order that the desired sealing effect may be obtained. For example, the seal can in the first operating state be spaced apart from each optical element of the projection objective, also e.g. from the second optical surface or the second optical element. This has the advantage that the seal does not cause interfering forces on the optical elements of the projection objective 150 if the projection exposure installation is working in the desired operation as regards the immersion liquid. In the second state of the immersion liquid deviating from the first operating state, the projection exposure installation works with high probability in an undesirable state in which there is a risk that the liquid 4 will penetrate into the objective 150, which is why the seal, e.g., at the second optical surface or the second optical element, or a holding device for this makes a sealing contact for this.

Figure 7:
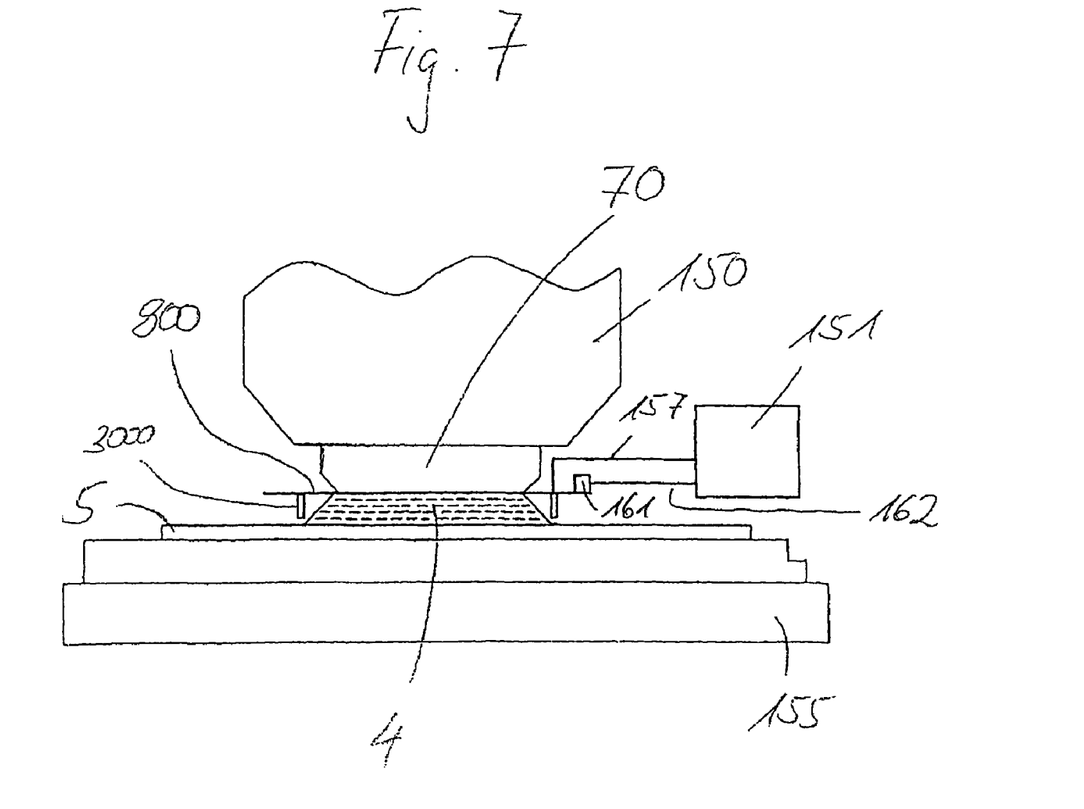
FIG. 7 is a cross-sectional view of a third embodiment of an inventive immersion objective.

FIG. 7 shows a further embodiment of an immersion objective 150, in which the final element 70 in turn is in contact with the immersion liquid 4. In an alternative to the sealing carrier 80 of the embodiment of FIG. 5, the embodiment of FIG. 7 is provided with a sealing bearing 800 that is formed identically with the sealing carrier 80 of FIGS. 4 and 5, with the exception that a further actuatable seal 3000 is additionally provided on the lower surface that limits the region of the immersion liquid 4. Especially, the seal 3000 can be implemented in turn as a contactless seal that is held at a distance from the wafer 5 or the photosensitive layer. To this end, a positional sensor 151 can be provided on the sealing bearing 800 that sends output signals over the data and/or signal line 162 to the control and/or regulation unit 151. This in turn can process these data and actuate the seal 3000 or corresponding actuators via the data and/or signal line 157 to keep the distance between the seal 3000 and the wafer 5 constant for as long as the immersion liquid between the wafer 5 and the final element 70 of the immersion objective 150 is to be maintained. In the event that illumination is concluded, and the immersion liquid is being suctioned off, the seal 3000 can be retracted.

The preceding embodiments are quoted only for the purpose of illustration and do not represent a restriction on the scope of protection. Especially, all combinations of the embodiments shown, under exchange or aggregation of individual characteristics, are conceivable and comprised by the scope of protection.

What is claimed is:

1. A device for holding an optical element, the device comprising:
   at least one holding element for mounting the optical element; and
   at least one sealing element constructed and arranged to provide sealing contact to at least a part of at least one of the optical element and the holding element;
   wherein at least a part of the sealing element is a movable part that is displaceable between a first position in which the sealing element seals against at least one of the optical element and the holding element, and a second position in which the sealing element is spaced apart from at least one of the optical element and the holding element.

2. The device as claimed in claim 1, wherein the optical element is an optical lens.

3. The device as claimed in claim 1, wherein the movable part of the sealing element is switchable such that the sealing element rests against the optical element with an adjustable contact force.

4. The device as claimed in claim 3, wherein the contact force is adjustable by movement of the movable part of the sealing element into different positions relative to at least one of the optical element and the holding element.

5. The device as claimed in claim 1, wherein the holding element comprises a liquid-tight mount, which surrounds the optical element on one side.

6. The device as claimed in claim 5, wherein the holding element comprises the liquid-tight mount which surrounds the optical element on a lateral surface of the optical element.

7. The device as claimed in claim 1, wherein the sealing element in combination with the holding element is constructed and arranged to support the optical element.

8. The device as claimed in claim 1, further comprising at least one supporting element which mounts the optical element to the holding element when the sealing element is in the second position.

9. The device as claimed in claim 1, wherein the holding element and the sealing element are constructed and arranged to provide respective holding and sealing functions.

10. A device for holding an optical element which is in contact with a liquid, the device comprising:
    at least one holding element for mounting the optical element;

wherein the at least one holding element is constructed and arranged to provide low-stress holding of the optical element; and wherein the holding element comprises a plurality of holding points or holding surfaces, each holding point or holding surface of the plurality of holding points or surfaces being spaced apart from one another, and wherein the plurality of holding points or holding surfaces accommodates the optical element by positive locking.

11. The device as claimed in claim 10, wherein the at least one holding element is constructed and arranged to provide holding that is permeable to the liquid.

12. The device as claimed in claim 10, wherein the optical element is a last optical element of an immersion objective that comprises a plurality of optical elements.

13. The device as claimed in claim 10, wherein the holding element comprises no sealing or adhesive compounds.

14. The device as claimed in claim 10, wherein the holding element comprises an annular body that surrounds the optical element, and wherein the holding element comprises at least one holder disposed between the annular body and the optical element, the at least one holder being constructed and arranged to provide positive locking of the annular body and the optical element.

15. The device as claimed in claim 10, further comprising at least one sealing element provided separately and independently of the holding element such that the sealing and holding functions are separate and independent of each other.

16. The device as claimed in claim 10, further comprising at least one actuatable sealing element, the actuatable sealing element being pneumatically, hydraulically, electrically, or piezoelectrically actuatable.

17. The device as claimed in claim 10, wherein the device is incorporated in a microlithography apparatus.

18. The device as claimed in claim 10, wherein the device is incorporated in a projection objective.

19. The device as claimed in claim 10, further comprising:
at least one sealing element including a movable component;
wherein the movable component is displaceable between a first position in which the sealing element seals against at least one of the optical element and the holding element, and a second position in which the sealing element is spaced apart from the optical element.

20. A device for holding an optical element which is in contact with a liquid, the device comprising:
at least one holding element for mounting the optical element; and
at least one sealing element including a movable component;
wherein the at least one holding element is constructed and arranged to provide low-stress holding of the optical element; and
wherein the movable component is displaceable between a first position in which the sealing element seals against at least one of the optical element and the holding element, and a second position in which the sealing element is spaced apart from the optical element.

21. The device as claimed in claim 20, wherein the movable component of the at least one sealing element is switchable such that it rests against at least one of the optical element and holding element with adjustable contact force.

22. The device as claimed in claim 21, wherein the contact force is adjustable by movement of the movable component of the sealing element into different positions relative to at least one of the optical element and the holding element.

23. The device as claimed in claim 20, wherein the movable component of the at least one sealing element is displaceable into a multiplicity of positions between the first and second positions.

24. The device as claimed in claim 20, wherein the at least one sealing element is arranged between the holding element and the optical element; and wherein the at least one sealing element comprises sealing surfaces both relative to the holding element and relative to the optical element.

25. The device as claimed in claim 20, wherein the at least one sealing element is provided opposite at least one sealing surface of at least one of the optical element and the holding element, said sealing surface extending transverse to an optical axis of the optical element.

26. The device as claimed in claim 25, wherein the movable component of the at least one sealing element is movable parallel to the optical axis of the optical element between a sealing position and a non-sealing position.

27. The device as claimed in claim 25, wherein the at least one sealing element is held at a distance from the sealing surface to be sealed such that a gap is formed which, on account of surface tension effects, is sufficient to prevent a liquid to be held at bay from passing through the gap.

28. The device as claimed in claim 20, wherein the movable component of the at least one sealing element is provided on a corresponding at least one movable carrier.

29. The device as claimed in claim 20, wherein the at least one sealing element comprises at least one of a folding bellows, an elastic, and a rubber-elastic component.

30. The device as claimed in claim 20, further comprising at least one actuator coupled to the at least one sealing element and constructed and arranged to provide movement of at least one movable sealing surface.

31. The device as claimed in claim 30, further comprising at least one reinforcing element disposed between the actuator and the movable sealing surface.

32. The device as claimed in claim 20, wherein the at least one sealing element comprises a sealing ring.

33. The device as claimed in claim 20, wherein the sealing element further comprises at least one shielding element which extends in front of the holding element.

34. The device as claimed in claim 20, further comprising:
a control unit; and
a detection unit for the state of the optical element;
wherein the control unit and the detection unit are constructed and arranged to interact to control actuation of the movable component of the at least one sealing element.

35. The device as claimed in claim 34, wherein the detection unit comprises a sensor.

36. The device as claimed in claim 35, wherein the sensor comprises at least one of a position sensor, a liquid sensor, an optical sensor, a vibration sensor, and a movement sensor.

37. A device for holding an optical element which is in contact with a liquid, the device comprising:
at least one holding element for mounting the optical element;
wherein the at least one holding element is constructed and arranged to provide low-stress holding of the optical element;
wherein the holding element comprises an annular body that surrounds the optical element; and
wherein the holding element comprises at least one holder disposed between the annular body and the optical element, the at least one holder being constructed and arranged to provide positive locking of the annular body and the optical element.

38. The device as claimed in claim 37, wherein the at least one holding element is constructed and arranged to provide holding that is permeable to the liquid.

39. The device as claimed in claim 37, wherein the optical element is a last optical element of an immersion objective that comprises a plurality of optical elements.

40. The device as claimed in claim 37, wherein the holding element comprises a plurality of holding points or holding surfaces, each holding point or holding surface of the plurality of holding points or surfaces being spaced apart from one another, and wherein the plurality of holding points or holding surfaces accommodates the optical element by positive locking.

41. The device as claimed in claim 37, wherein the holding element comprises no sealing or adhesive compounds.

42. The device as claimed in claim 37, further comprising at least one sealing element including a movable component; and wherein the movable component is displaceable between a first position in which the sealing element seals against at least one of the optical element and the holding element, and a second position in which the sealing element is spaced apart from the optical element.

43. The device as claimed in claim 37, further comprising at least one sealing element provided separately and independently of the holding element such that the sealing and holding functions are separate and independent of each other.

44. The device as claimed in claim 37, further comprising at least one actuatable sealing element, the actuatable sealing element being pneumatically, hydraulically, electrically, or piezoelectrically actuatable.

45. The device as claimed in claim 37, wherein the optical element is one of an optical lens and a transparent protective element.

46. The device as claimed in claim 37, wherein the device is incorporated in a microlithography apparatus.

47. The device as claimed in claim 37, wherein the device is incorporated in a projection objective.

* * * * *